(12) United States Patent
Kuster

(10) Patent No.: US 8,304,801 B2
(45) Date of Patent: Nov. 6, 2012

(54) ILLUMINATING MEANS

(75) Inventor: Martin Kuster, Walchwill (CH)

(73) Assignee: Victorinox AG, Ibach (CH)

( * ) Notice: Subject to any disclaimer, the term of this patent is extended or adjusted under 35 U.S.C. 154(b) by 66 days.

(21) Appl. No.: 12/475,065

(22) Filed: May 29, 2009

(65) Prior Publication Data

US 2010/0084666 A1      Apr. 8, 2010

(30) Foreign Application Priority Data

May 30, 2008   (AT) .................................. A 876/2008

(51) Int. Cl.
  *H01L 33/00* (2010.01)
  *H01L 29/20* (2006.01)
(52) U.S. Cl. .............. 257/99; 257/89; 257/98; 257/100; 257/E33.044; 257/E33.058; 257/E33.059; 257/E33.061; 257/E33.062; 257/E33.066; 257/E33.068
(58) Field of Classification Search .................. None
  See application file for complete search history.

(56) References Cited

U.S. PATENT DOCUMENTS

| | | | | |
|---|---|---|---|---|
| 4,322,735 A * | 3/1982 | Sadamasa et al. | ............. | 257/89 |
| 5,013,144 A | 5/1991 | Silverglate et al. | | |
| 5,218,233 A * | 6/1993 | Takahashi | ..................... | 257/787 |
| 5,289,082 A * | 2/1994 | Komoto | ....................... | 313/500 |
| 5,324,962 A * | 6/1994 | Komoto et al. | ................. | 257/89 |
| 5,564,819 A * | 10/1996 | Yamaguchi | .................. | 362/241 |
| 5,813,753 A * | 9/1998 | Vriens et al. | .................. | 362/293 |
| 6,054,716 A * | 4/2000 | Sonobe et al. | ................ | 250/552 |
| 6,621,223 B1 * | 9/2003 | Hen | ................................ | 315/56 |
| 7,066,626 B2 * | 6/2006 | Omata | .......................... | 362/257 |
| 7,102,283 B2 * | 9/2006 | Choi et al. | ..................... | 313/512 |
| 7,476,913 B2 * | 1/2009 | Isobe et al. | ..................... | 257/98 |
| 7,902,568 B2 * | 3/2011 | Morikawa et al. | ............ | 257/100 |
| 2005/0199899 A1 * | 9/2005 | Lin et al. | ......................... | 257/99 |
| 2006/0027829 A1 * | 2/2006 | Wang et al. | ..................... | 257/99 |
| 2007/0063213 A1 * | 3/2007 | Hsieh et al. | ..................... | 257/99 |
| 2007/0235743 A1 * | 10/2007 | Lee et al. | ........................ | 257/81 |
| 2007/0295975 A1 * | 12/2007 | Omae | ............................. | 257/89 |

FOREIGN PATENT DOCUMENTS

WO    WO-2007/010879 A2    1/2007

OTHER PUBLICATIONS

Austrian Office Action, dated Apr. 30, 2009 for Austrian Application No. A876/2008.

* cited by examiner

*Primary Examiner* — Hoang-Quan Ho
(74) *Attorney, Agent, or Firm* — Edwards Wildman Palmer LLP; David Weild, III; Adam P. Daniels

(57) ABSTRACT

An illuminating means, including a radiation source for emitting electromagnetic radiation in the optical range, a support base, and an electrode arrangement with a first and at least a second electrode. The radiation source is disposed on the support base and connected by connecting wires to the electrode arrangement so as to be electrically conductive, and the radiation source is provided in the form of a first and at least a second semiconductor component. The first electrode is connected to the first semiconductor component via a first contact point, and the second electrode is connected to the second semiconductor component via a second contact point, so as to be electrically conductive. The distance of the first contact point from a center point or a line of symmetry of the support base is different from the distance of the second contact point from the center point or line of symmetry.

12 Claims, 2 Drawing Sheets

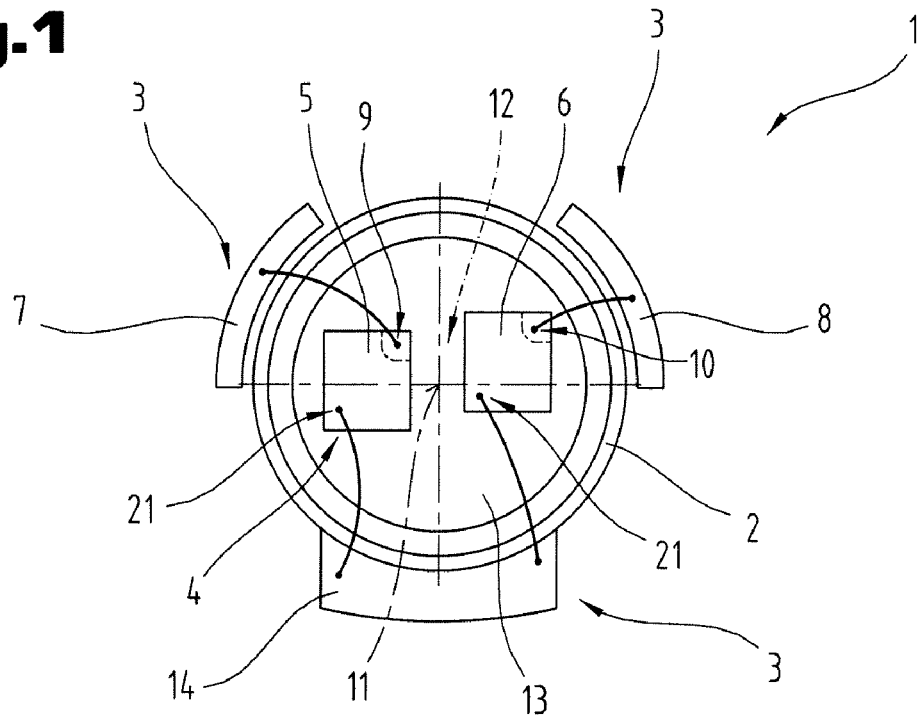
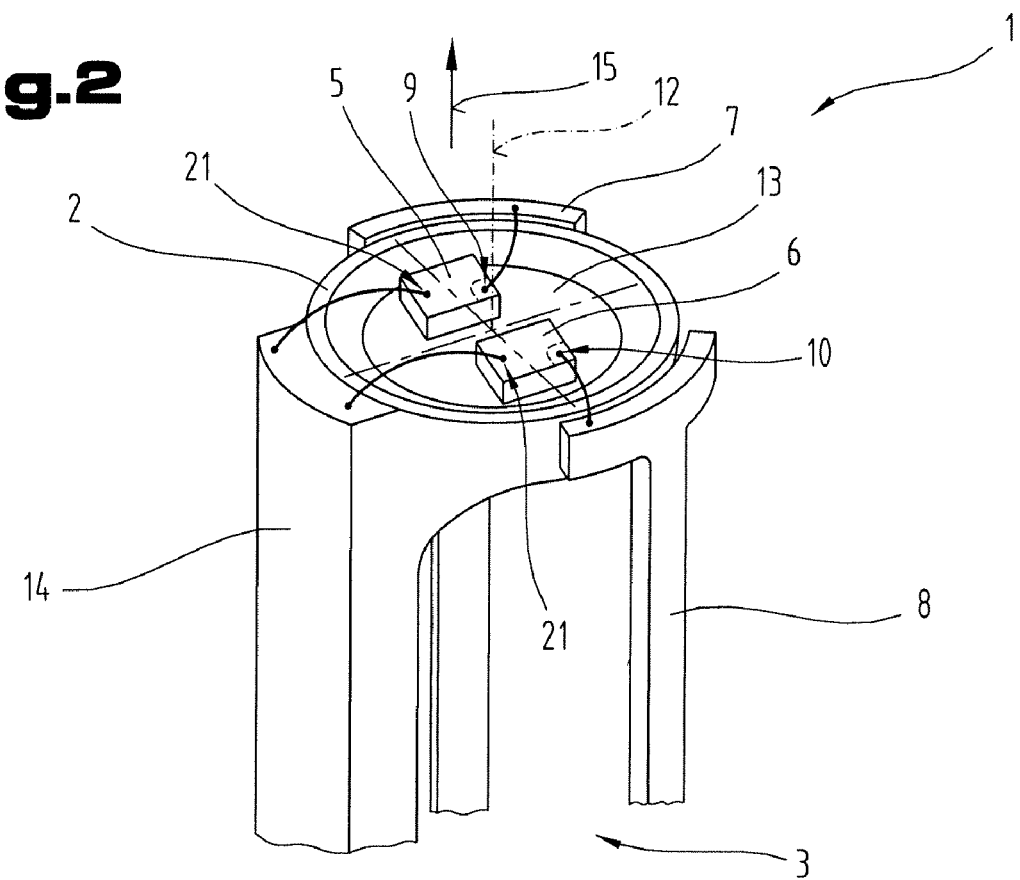

ILLUMINATING MEANS

CROSS REFERENCE TO RELATED APPLICATION

This application claims priority to Austrian Patent Application No. AT A 876/2008, filed May 30, 2008, the entire disclosure of which is herein incorporated by reference.

BACKGROUND OF THE INVENTION

1. Field of the Invention

The invention relates to an illuminating means, comprising a radiation source for emitting electromagnetic radiation in the optical range, a support base and an electrode arrangement with a first and at least a second electrode, and the radiation source is disposed on the support base and is connected to the electrode arrangement so as to be electrically conductive by means of connecting wires, and the radiation source is provided in the form of a first and at least a second semiconductor component, and the first electrode is connected to the first semiconductor component via a first contact point to as to be electrically conductive and the second electrode is connected to the second semiconductor component via a second contact point so as to be electrically conductive.

2. Prior Art

Illuminating means which are based on the generation of non-thermal radiation are usually characterized as having a particularly high degree of efficiency, a long service life and a compact structure and are also particularly robust in terms of ability to withstand mechanical stress. Especially due to their compact structure, such illuminating means are usually used in different modules and a preferred arrangement is one in which the illuminating means is a module integrated in a bigger module. Due to the high degree of integration, however, replacement in the event of damage is usually not possible or is so to a very limited degree only. For example, illuminating means of this type are more often than not disposed in a module and are secured in it by means of a filler material and tightly sealed off from ambient influences such as moisture or aggressive gases, for example. If an illuminating means fails, this can therefore lead to a restriction in function, as a result of which additional illuminating means not intended for the specific function are provided as a replacement in a known manner. During operation for the intended function, these illuminating means are not active and are not switched on unless an illuminating means is damaged, thereby increasing the cost of the illuminating means on the one hand and also requiring additional space in order to accommodate it.

Known illuminating means based on semiconductor modules have a particular disadvantage in that, because of the electrical contact needed, a part-portion of the light-emitting surface is placed in shadow by the contact point. As a result, the image irradiated by such illuminating means has a region with significantly reduced radiation intensity, which is a disadvantage in terms of generating illumination that is as uniform as possible.

SUMMARY OF THE INVENTION

The objective of the invention is to propose an illuminating means that is as far as possible not susceptible to failure, which emits radiation that has a radiation image that is as uniform as possible.

This objective is achieved by the invention due to the fact that the distance of the first contact point from a center point or a line of symmetry of the support base is different from the distance of the second contact point from the center point or line of symmetry of the support base. The support base, in particular the portion on which the first and second semiconductor component is disposed, usually always has a sort of symmetry. For example, the support base may be of a largely circular or rectangular, in particular square, design. The support base may comprise other components or additional components may be disposed around the support base. The properties in terms of symmetry in this respect relate exclusively to the portion of the support base on which the semiconductor components are disposed.

Viewed in macroscopic terms, the support base and the semiconductor components disposed on it may be considered akin to a light-emitting surface, and the emitted light is preferably emitted in a main beam direction. The other aspects concerning the specified symmetry relate to this main beam direction determined by the design.

In the case of known illuminating means, semiconductor components are usually disposed on the support base in a manner which makes the production process simple and practicable and they are disposed in the optical center, and the optical center usually coincides with the center point or line of symmetry. In particular, however, the contact points are usually disposed at an identical distance from a line of symmetry or from the center point. As a result of this arrangement, however, a shadow is created in the region of the portion of the semiconductor components emitting the light, which leads to a portion with a significantly reduced radiation intensity in the emitted light beam.

In a particularly advantageous manner, the design proposed by the invention ensures that the light beams emitted by the first and second semiconductor component are superimposed in such a way that the intensity fluctuation in the optical path caused by the structural design is eliminated or reduced. The design proposed by the invention has another advantage in that, because the first and second semiconductor components are activated in a specific way, a redundant illuminating means is obtained, the particular advantage of which is that every individual semiconductor component can be activated with a power that is lower than the maximum power whilst nevertheless obtaining a very high radiation intensity. As a result of this advantageous design, the load of the individual semiconductor components is significantly reduced, and in particular the unavoidable heat generated is reduced which results in increased operating safety and in particular a longer service life.

The electrical connecting wires between the electrodes and semiconductor components are preferably flexible wires which guarantee a reliable electrical contact and are able to compensate for the effects of expansion due to heat without leading to damage.

Also of advantage is another embodiment in which the first and second semiconductor components are provided in the form of light-emitting diodes. Light-emitting diodes belong to the group of direct semiconductors, whereby, in simple terms, electromagnetic radiation in the optical range is emitted by electrically exciting the semiconductor material in the recombination layer. Light-emitting diodes therefore have the particular advantage of generating light due to interactions in a semiconductor material, which offers a significantly higher degree of efficiency than generating light thermally. Light-emitting diodes are therefore particularly robust and durable, which is a very decisive advantage in the case of lamp modules comprising several illuminating means proposed by the invention. Light-emitting diodes have another advantage in that the spectral range of the emitted light can be specifically set within broad ranges due to the choice of material used for the recombination layer. This being the case, the emitted spectral range usually has only a very low spectral width.

By choosing the materials of the semiconductor components accordingly, advantageous embodiments can be achieved whereby the first and/or second semiconductor component emits electromagnetic radiation in the optically visible range respectively in the optically non-visible range. By means of an appropriate choice of material combinations, the semiconductor component may advantageously be designed so that it emits directly visible light. Also based on appropriate material combinations, it is possible to design semiconductor components which emit electromagnetic radiation in the optically non-visible range. As a result of these advantageous embodiments, an illuminating means can be obtained which is designed for emitting light in a very broad range of the optical spectral range.

In terms of the electrical contacts of the semiconductor components, an embodiment which offers an advantage is one in which the support base is electrically conductive because it then constitutes an electrode, in particular a third electrode of the electrode arrangement. With this embodiment, the number of electrical feeder electrodes is reduced and in particular production of the illuminating means proposed by the invention is made easier. An electrically conductive support base offers another advantage in that electrically conductive materials are also usually good heat conductors and any thermal discharge can be readily dispersed.

To enable the semiconductor components to be individually activated, an additional controller module may optionally be disposed on the support base. This module may activate the first and second semiconductor component in a specifically different way in order to produce different light characteristics. For example, the two semiconductor components may emit electromagnetic radiation in different spectral ranges, thereby enabling the combined color of the emitted electromagnetic radiation to be adjusted by means of the controller module. Since the semiconductor component and the controller module may optionally be operated at a different electrical potential, another embodiment is of particular advantage because the support base is not electrically conductive and this will not lead to any mutual electrical influence between the semiconductor components or between the semiconductor components and the controller module.

Due to the fact that a third electrode is connected to the first and second semiconductor component via a third contact point in each case so as to be electrically conductive, an illuminating means is obtained which permits a specific and in particular separate activation of the two semiconductor components. From a thermal point of view, however, this embodiment has another particular advantage because heat expansion of the semiconductor components does not affect the reliability of the electrical contacts due to the specific operating mode. When the semiconductor components are operating, some of them become very hot and this lost heat can mostly be fed away via the support base, which is of a large volume. In order to provide the electrical contacts, the semiconductor components may optionally be connected to the support base so as to be electrically conductive, and these contacts must assure the electrical supply and must also be capable of withstanding the mechanical tensions which occur due to heat expansion, which can cause damage to the connection during long periods of operation. Connecting the semiconductor components to the support base therefore enables optimum use to be made of good heat conduction without any detrimental effect to the electrical supply or without having to make allowance for it.

The third contact points may naturally also each be at a different distance from a center point or line of symmetry of the support base, thereby securing the above-mentioned advantages of improving the distribution of the radiation intensity.

A particularly advantageous embodiment is obtained if the support base is provided in the form of an optical reflector. Due to their structural design, the semiconductor components usually have a main beam direction, which may not correspond to the desired radiation direction and radiation characteristic of the illuminating means. By providing the support base as an optical reflector, some of the irradiated light can be deflected in the direction of the desired main beam direction, which significantly improves optical efficiency.

Also of advantage is an embodiment in which a photoactive material is disposed on the support base. The photoactive material is preferably luminescent, which means that electromagnetic radiation is emitted due to excitation, preferably in another spectral range. Due to material properties brought about by the technology used, radiation can not be generated in the entire optical spectral range with semiconductor components. In the case of this embodiment, it is now advantageously possible to transfer electromagnetic radiation emitted by the photoactive material into another spectral range or broaden the emitted spectral range. For example, white light can not be generated directly by semiconductor components and instead, a semiconductor irradiating in the blue spectral range is preferably provided on the support base. The specified photoactive material disposed on the support base is excited with blue light when power is applied and emits electromagnetic radiation in a broad spectral range due to a spontaneous-emission so that white light is emitted as a whole by the illuminating means. Also conceivable are embodiments whereby light is emitted by the semiconductor component in the non-visible optical spectral range and transferred by the photoactive material into the visible range.

In addition to a center point or line of symmetry of the support base, the illuminating means proposed by the invention usually also has an optical axis, which preferably corresponds to the main irradiating direction of the illuminating means proposed by the invention. In one advantageous embodiment, the first and second contact point are at a different distance from an optical axis of the illuminating means, thereby ensuring that the electromagnetic radiation emitted by the first and second semiconductor component is advantageously superimposed so that the differences in brightness in the light beam caused by the structural design are largely compensated. This embodiment also ensures that, irrespective of the specific design details of the semiconductor components and support base, the semiconductor components are disposed and contacted in such a way that the emitted light beams are structurally superimposed so that the intensity of the emitted light beam is uniform.

The claimed embodiment may naturally also be used for an embodiment in which the semiconductor components are contacted so as to be electrically conductive via third contact points, thereby obtaining the advantages already described above.

One advantageous embodiment can be obtained in which the support base and the electrode arrangement are disposed in a housing and the housing is made from a light-guiding material. The advantage of providing a housing is that the semiconductor components are provided with sufficient mechanical protection and the process of assembling or fitting the illuminating means in another module is made much easier. If the housing is made from a light-guiding material, a particular advantage is obtained because light can already be deflected or light collected by this material, which again enables the optical efficiency of the illuminating means proposed by the invention to be improved. The light-guiding material may also be designed to produce specific spectral filtering for example, in which case undesired spectral components can be filtered out and as narrow a spectral range as possible can be emitted. However, the light-guiding material may also be of the type designed to produce diffuse scattering so that an illuminating effect can be achieved in as wide as possible a spatial range by reference to an optical axis of the illuminating means.

In terms of shaping the beam or directing the emitted electromagnetic radiation, the housing may have a light-deflecting element in another embodiment. Such an element might be an optical lens for example, which is disposed in the optical path of the electromagnetic radiation, thereby enabling the opening angle of the emitted electromagnetic radiation to be fixed due to its design in terms of focal points. It is preferable to opt for an opening angle of 22° because this enables largely directed radiation to be emitted.

In another embodiment, it is possible to direct the beam solely due to the fact that the semiconductor components are disposed so that a directional characteristic is imparted to the emitted light beam due to a constructive and destructive superimposition. This also enables the opening angle to be fixed, again preferably at 22°.

In the case of known illuminating means, a highly integrated semiconductor component is usually disposed on a support base, and the semiconductor component may optionally have several light-emitting elements which are electrically contacted in known manner, which leads to intensity fluctuations in the cross-section of the emitted light beam. In the case of the claimed embodiment in which the first and second semiconductor component are spaced apart from one another on the support base, it is advantageously possible to ensure that the occurrence of intensity fluctuations in the emitted light beam can already be significantly reduced by the spaced arrangement.

BRIEF DESCRIPTION OF THE DRAWINGS

To provide a clearer understanding, the invention will be explained in more detail below with reference to the appended drawings.

These provide schematically simplified diagrams as follows:

FIG. 1 is a plan view illustrating one embodiment of the illuminating means proposed by the invention;

FIG. 2 is a perspective diagram of the illuminating means illustrated in FIG. 1;

DETAILED DESCRIPTION OF PREFERRED EMBODIMENTS

Figure 3:
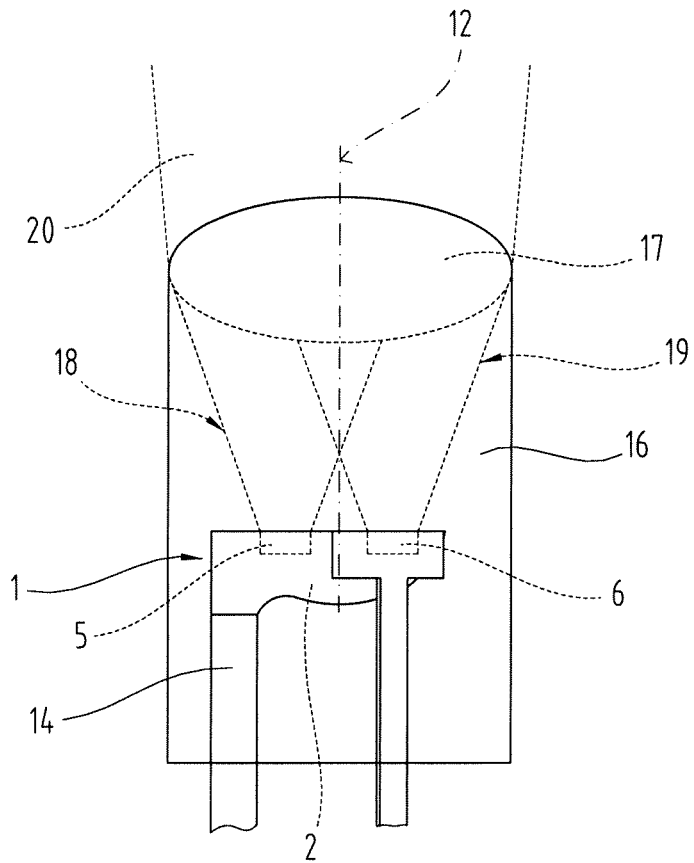
FIG. 3 illustrates another embodiment of the illuminating means proposed by the invention.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc., relate to the drawing specifically being described and can be transposed in terms of meaning to a new position when another position is being described. Individual features or combinations of features from the different embodiments illustrated and described may be construed as independent inventive solutions or solutions proposed by the invention in their own right.

All the figures relating to ranges of values in the description should be construed as meaning that they include any and all part-ranges, in which case, for example, the range of 1 to 10 should be understood as including all part-ranges starting from the lower limit of 1 to the upper limit of 10, i.e. all part-ranges starting with a lower limit of 1 or more and ending with an upper limit of 10 or less, e.g. 1 to 1.7, or 3.2 to 8.1 or 5.5 to 10.

FIG. 1 illustrates an embodiment of the illuminating means 1 proposed by the invention comprising a support base 2, an electrode arrangement 3 and a source of electromagnetic radiation 4. The source of electromagnetic radiation 4 is provided in the form of a first 5 and a second 6 semiconductor component, and the semiconductor components are preferably light-emitting diodes. The electrode arrangement 3 comprises a plurality of electrodes, in particular a first 7, second 8 and third 14 electrode. The first semiconductor component 5 is connected to the first electrode 7 so as to be electrically conductive, and the connecting wire establishes contact with the first semiconductor component 5 at a first contact point 9 to render it electrically conductive. The same applies to the second semiconductor component 6 and the second electrode 8, and the contact in this instance is established via a second contact point 10. Operating a light-emitting diode as a semiconductor component requires a double-pole electric supply. In the case of the embodiment illustrated, the semiconductor components 5, 6 are connected via third contact points 21 to the third electrode 14 rendering them electrically conductive.

In the embodiment illustrated, the support base 2 is of an essentially circular design, which enables a center point 11 of the geometric shape of the support base to be unequivocally defined. However, the support base may be of any other geometric shape, for example rectangular or square, in which case a line of symmetry 12 is defined for these embodiments. The main aspect of the illuminating means proposed by the invention is that the first 9 and second 10 contact point are disposed at a different distance from the center point 11 or line of symmetry 12. In particular, this means that the first 9 and second 10 contact point on the first 5 and second 6 semiconductor component are disposed so that the arrangement is not symmetrical with respect to the center point 11 or line of symmetry 12. The same applies to the disposition of the third contact points 21 on the semiconductor components 5, 6.

The first 5 and second 6 semiconductor components are preferably designed so that electromagnetic radiation is emitted largely in the same spectral range, in which case this may be the optically visible range. However, another embodiment would also be possible where the semiconductor components emit light in the non-visible optical range, which is transferred into the optically visible range by an optically active material. An optically active material 13 of this type, or transfer material, is preferably disposed on the support base 2 in such a way that the electromagnetic radiation emitted by the first 5 and second 6 semiconductor components is able to act directly on the optically active material 13, where it is transferred into a different wavelength range for emitting light, preferably due to a spontaneous emission, in particular in the visible optical range.

FIG. 2 is a perspective diagram illustrating the illuminating means 1 shown in FIG. 1. The support base 2 is preferably provided in the form of an optical reflector in order to deflect the light emitted by the semiconductor components and optionally the light transferred by the optically active material 13 into what is preferably a main radiating direction 15. The main radiating direction 15 usually also coincides with a line of symmetry 12, which means that there are no or only very slight differences in intensity in the cross-sectional surface of the emitted light beam due to the disposition of the first 9 and second 10 contact point as well as the third contact points 21 proposed by the invention. The unavoidable shadowing caused by the contact points 9, 10, 21 may be seen in the largely circular cross-section of the emitted light beam in a circle of lesser intensity. As a result of the arrangement proposed by the invention, the light beams of the two semiconductor components 5, 6 are superimposed so that the radiation intensity is largely compensated and a uniform light image is obtained.

Providing the support base 2 in the form of a reflector offers a first option for deflecting the beam or shaping the beam. Another beam-shaping device may optionally be disposed in the optical path 15, in which case it is preferably an optically acting lens, as illustrated in FIG. 3, for example.

FIG. 3 illustrates another possible embodiment, where the illuminating means 1 proposed by the invention is disposed in a housing 16, and a beam-directing device 17 is disposed in the housing, preferably in the form of an optical lens. A first light beam 18 is emitted by the first semiconductor component 5, a second light beam 19 is emitted by the second semiconductor component 6, and because the support base 2 is provided in the form of a reflector, the light beams are already largely deflected in the direction 15 of the beam-directing device 17. Due to the electrical contact points on the semiconductor components, there are portions of reduced light intensity in the first 18 and second 19 optical path. By superimposing the two light beams and in particular by bringing the two light beams together by means of the beam-directing device 17, the resultant optical path 20 has a uniform intensity distribution, and in particular the differences in intensity caused by the structural design are largely compensated. This advantageous embodiment ensures that a light beam 20 is emitted with a largely constant intensity across the cross-section.

Another advantage of the beam-directing device 17 in combination with the design of the support base 2 is that the opening angle of the optical path 20 can be set in broad ranges and it is preferable if a radiation angle of 22° is chosen, thereby corresponding to radiation that is directed as much as possible.

Another advantageous embodiment is obtained if the first 5 and second 6 semiconductor components are activated in a specific way. In order to achieve as high intensity as possible of the optical path 20, it is standard practice in the case of known devices incorporating a semiconductor component to operate the latter at the maximum possible power so as to obtain the highest possible intensity of emitted light. In the case of the illuminating means proposed by the invention, it is advantageously possible to activate both illuminating means 5, 6 at a reduced power and nevertheless achieve a high radiation intensity of the optical path 20. The advantage of this is that each semiconductor component is placed under significantly less load, which reduces the amount of heat generated whilst nevertheless ensuring high total radiation intensity.

In the case of another embodiment of the electrode arrangement proposed by the invention, it is also possible to operate one semiconductor component at its rated power whilst the second semiconductor component is then not used except as a back-up in the event of failure if the first semiconductor component becomes damaged or if the emitted light intensity drops below a threshold value due to ageing. The advantage which this embodiment of the illuminating means proposed by the invention offers is that in spite of having compact dimensions, operating safety is high and at the same time the radiation intensity in the emitted light beam is as uniform as possible. Other options for activating the two semiconductor components might be for the individual components to be activated in a pulsed arrangement, for example, in which case the load on the individual component is again reduced whilst nevertheless obtaining high and uniform radiation intensity.

Figure 4:
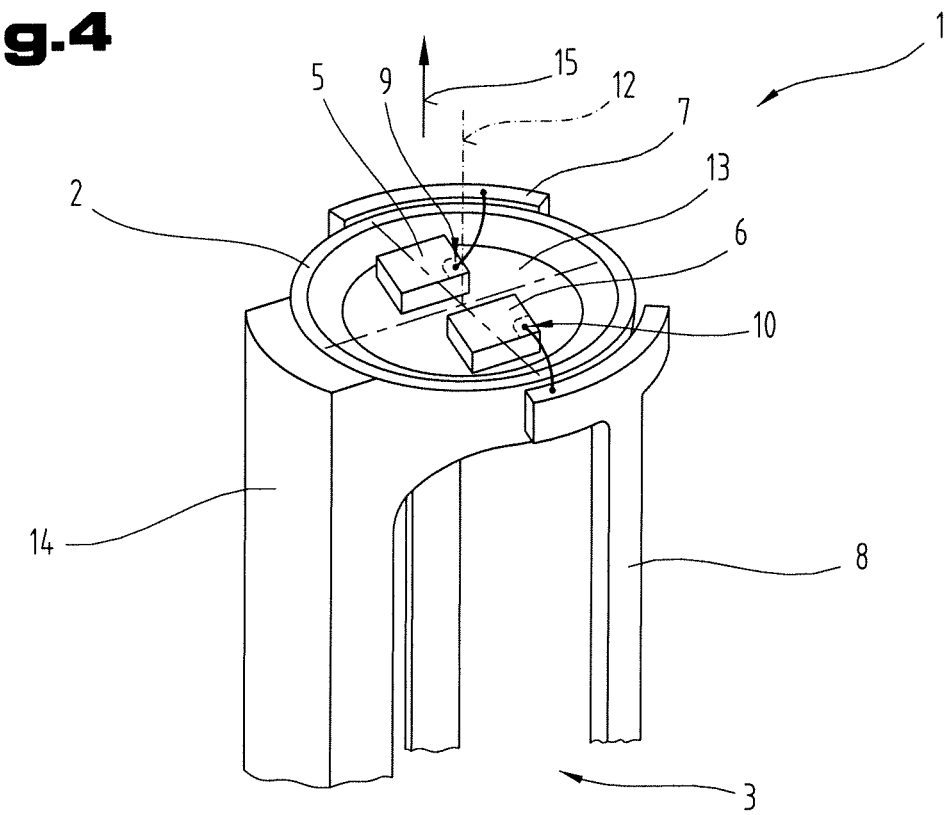
FIG. 4 is a perspective diagram illustrating another embodiment of the illuminating means proposed by the invention.

FIG. 4 illustrates another embodiment of the illuminating means proposed by the invention, where the support base 2 is of an electrically conductive design and thus constitutes the third electrode 14 of the electrode arrangement 3. The advantage of this embodiment is that the electrical contacts of the semiconductor components are established via the support base and there is no need to provide additional connecting wires, which represents a significant saving on manufacturing costs. In particular, there is no need to provide third contact points for the semiconductor components 5, 6.

The embodiments illustrated as examples represent possible variants of the illuminating means and it should be pointed out at this stage that the invention is not specifically limited to the variants specifically illustrated, and instead the individual variants may be used in different combinations with one another and these possible variations lie within the reach of the person skilled in this technical field given the disclosed technical teaching. Accordingly, all conceivable variants which can be obtained by combining individual details of the variants described and illustrated are possible and fall within the scope of the invention.

FIG. 4 illustrates another and optionally independent embodiment of the illuminating means, the same reference numbers and component names being used for parts that are the same as those illustrated in FIGS. 1 to 3 above. To avoid unnecessary repetition, reference may be made to the detailed description of these drawings given above.

For the sake of good order, finally, it should be pointed out that, in order to provide a clearer understanding of the structure of the illuminating means, it and its constituent parts are illustrated to a certain extent out of scale and/or on an enlarged scale and/or on a reduced scale.

The objective underlying the independent inventive solutions may be found in the description.

Above all, the individual embodiments of the subject matter illustrated in FIGS. 1 to 4 constitute independent solutions proposed by the invention in their own right. The objectives and associated solutions proposed by the invention may be found in the detailed descriptions of these drawings.

| List of reference numbers | |
|---|---|
| 1 | Illuminating means |
| 2 | support base |
| 3 | Electrode arrangement |
| 4 | Source of electromagnetic radiation |
| 5 | First semiconductor component |
| 6 | Second semiconductor component |
| 7 | First electrode |
| 8 | Second electrode |
| 9 | First contact point |
| 10 | Second contact point |
| 11 | Center point |
| 12 | Line of symmetry |

| | List of reference numbers |
|---|---|
| 13 | Photoactive material |
| 14 | Third electrode |
| 15 | Optical axis, direction, optical path |
| 16 | Housing |
| 17 | Beam-directing device, lens |
| 18 | First light beam |
| 19 | Second light beam |
| 20 | Optical path |
| 21 | Third contact point |

LIST OF REFERENCE NUMBERS

1 Illuminating means
2 support base
3 Electrode arrangement
4 Source of electromagnetic radiation
5 First semiconductor component
6 Second semiconductor component
7 First electrode
8 Second electrode
9 First contact point
10 Second contact point
11 Center point
12 Line of symmetry
13 Photoactive material
14 Third electrode
15 Optical axis, direction, optical path
16 Housing
17 Beam-directing device, lens
18 First light beam
19 Second light beam
20 Optical path
21 Third contact point

What is claimed is:

1. Illuminating means comprising:
   a radiation source for emitting electromagnetic radiation in the optical range,
   a support base and an electrode arrangement with a first and at least a second electrode, the radiation source being disposed on the support base, which is configured as a third electrode, and being connected by means of connecting wires to the electrode arrangement so as to be electrically conductive,
   wherein the radiation source is provided in the form of a first and at least a second semiconductor component that are configured to activate independently,
   wherein the first electrode and the third electrode are connected to the first semiconductor component so as to be electrically conductive and the second electrode and the third electrode are connected to the second semiconductor component so as to be electrically conductive, the first electrode is connected to the first semiconductor component via a first contact point and the second electrode is connected to the second semiconductor component via a second contact point,
   wherein the distance between the first contact point and an axis of symmetry of the support base is different from the distance between the second contact point and the axis of symmetry of the support base; and
   wherein the first and second contact points are positioned relative to one another such that a first light beam emitted from the first semiconductor component and a second light beam emitted from the second semiconductor component are superimposed on one another to compensate for a first and a second portion of reduced light intensity created by the first and second contacts, producing a combined light beam of uniform intensity.

2. Illuminating means according to claim 1, wherein the first and second semiconductor component is provided in the form of a light-emitting diode.

3. Illuminating means according to claim 1, wherein at least one of the first and second semiconductor component emits electromagnetic radiation in the visible optical range.

4. Illuminating means according to claim 1, wherein at least one of the first and second semiconductor component emits electromagnetic radiation in the non-visible optical range.

5. Illuminating means according to claim 1, wherein the support base is provided in the form of an optical reflector.

6. Illuminating means according to claim 1, wherein a photoactive material is provided on the support base.

7. Illuminating means according to claim 1, wherein the first and second contact points are at a different distance from an optical axis of the illuminating means.

8. Illuminating means according to claim 1, wherein the support base and the electrode arrangement are disposed in a housing and the housing is made from a light-guiding material.

9. Illuminating means according to claim 8, wherein the housing has a light-deflecting element.

10. Illuminating means according to claim 1, wherein the first and second semiconductor components are spaced at a distance apart from one another on the support base.

11. Illuminating means according to claim 1, further comprising:
    a controller module that activates the first semiconductor component and the second semiconductor component independently.

12. Illuminating means according to claim 11, wherein the two semiconductor components are activated independently to emit electromagnetic radiation in different spectral ranges.

* * * * *